United States Patent [19]

Reche

[11] Patent Number: 5,023,205
[45] Date of Patent: Jun. 11, 1991

[54] METHOD OF FABRICATING HYBRID CIRCUIT STRUCTURES

[75] Inventor: John J. Reche, Ventura, Calif.

[73] Assignee: Polycon, Tempe, Ariz.

[21] Appl. No.: 344,252

[22] Filed: Apr. 27, 1989

[51] Int. Cl.$^5$ .................................. H01L 21/312
[52] U.S. Cl. ........................... 437/228; 437/225; 437/245; 437/195; 148/DIG. 20; 156/657
[58] Field of Search ............... 437/225, 228, 245, 189, 437/195, 235; 148/DIG. 20; 156/657

[56] References Cited

U.S. PATENT DOCUMENTS

| | | | |
|---|---|---|---|
| 4,436,582 | 3/1984 | Saxena | 156/657 |
| 4,536,949 | 8/1985 | Takayama et al. | 437/228 |
| 4,605,470 | 8/1986 | Gwozdz et al. | 156/657 |
| 4,840,923 | 6/1989 | Flagello et al. | 437/189 |
| 4,892,843 | 1/1990 | Schmitz et al. | 437/189 |

Primary Examiner—Brian E. Hearn
Assistant Examiner—Tuan Nguyen
Attorney, Agent, or Firm—Blakely, Sokoloff, Taylor & Zafman

[57] ABSTRACT

Hybrid circuit structures and methods of fabrication which result in improved manufacturing yields and reliability in use are disclosed. The methods disclosed include methods of forming on the hybrid circuit substrate, a ground plane, bonding pads, and interconnects, which minimize the likelihood of forming catastrophic defects in various insulation layers during the manufacturing processing, which minimize the likelihood of damage to the bonding pads when bonding integrated circuit leads thereto, and which minimize the thermal stressing of a finished product due to the differential expansion between the various layers making up the same. Alternate methods and structures are disclosed.

10 Claims, 7 Drawing Sheets

METHOD OF FABRICATING HYBRID CIRCUIT STRUCTURES

BACKGROUND OF THE INVENTION

1. Field of the Invention

The present invention relates to the field of hybrid circuits, and more particularly to hybrid circuits for interconnecting unpackaged integrated circuits.

2. Prior Art

Hybrid circuits of various forms are well-known in the prior art. Such circuits have been generally used for the high density packaging of active and passive devices, more recently integrated circuits, discreet components and the like in a high density configuration. The densities that normally have been obtainable in the more conventional hybrid circuits are much higher than obtainable with packaged devices using conventional integrated circuit technology.

More recently, surface mount technology (SMT) methods have been used to at least approach the density of packaging theretofore obtainable in the prior hybrid circuits. In accordance with SMT, integrated circuits, discreet components, arrays of components, etc., are packaged not in the usual dual-in-line packages with conventional leads, lead spacing, etc., but rather with a minimal sized protective coating with relatively tightly spaced connection pads on one surface thereof. These SMT devices are typically solder bonded to an appropriately laid out and tightly packed printed circuit board to result in the required circuit board area for a given circuit which is only a fraction of that obtainable with conventional dual-in-line (DIP) packaging and printed circuit board layout techniques. Further, automatic SMT device mounting equipment and bonding equipment keeps the cost of SMT circuits down, particularly in high quantities, making this technology applicable even to consumer products. Also, in very recent years, there has been a considerable effort to develop larger and larger scale integrated circuits, with an ultimate goal of achieving wafer scale integration. While progress has been made in this direction, particularly with respect to microprocessor and microcomputer chip sets, the progress in other areas has been disappointingly slow to many people for various reasons. Smaller and smaller device sizes and line widths in integrated circuits have allowed substantial increases in integrated circuit complexity without requiring an equal increase in chip area. Further, except for microprocessor chip sets and memory devices wherein more is always better, it has been difficult to identify standardized functions for LSI and larger integrated circuits which will have a sufficient market volume to justify the same.

In addition to the foregoing, very large scale and larger integrated circuits generally have a bad yield problem which may only be overcome, at least in part, by providing on chip redundancy. In particular, a common approach to the yield problem is to provide redundancy for each functional part of the circuit, thereby increasing the required chip area by approximately 100 percent. While such redundancy can dramatically increase the yields by now requiring only one out of two of each functional block circuits to operate, rather than one out of one which would be required without redundancy, the effect of the redundancy is not only to increase chip size, but also to cause relatively long interconnects which substantially slow down the circuit because of the resulting relatively high parasitic capacitance.

As a result, considerable interest has developed in forming multi-chip modulus wherein a plurality of integrated circuits in chip form are mounted on a substrate and interconnected to provide the functions of VSLI and higher integration without the normally associated problems thereof. Such interconnecting devices, sometimes referred to as high density multi-layer interconnects (HDMI), allow the testing of individual integrated circuits before mounting, thereby eliminating the need for redundancy for suitable yields. This can allow closer connection of the functional blocks on the HDMI than could be achieved in a corresponding single chip device. In many cases, it can also result in a faster circuit by reducing parasitic capacitance, can eliminate the need for on-chip line drivers sometimes required because of the long interconnect lines on large single chip integrated circuits, can reduce costs by allowing testing of the integrated circuit functional blocks and the elimination of only the bad ones before using the same in the HDMI, and of course allows one to obtain the advantages of wafer scale integration without the attendant problems thereof even in applications wherein the market volume for the product is too small to consider larger scale or wafer scale integration.

At the present time, HDMI technology is somewhat of a mix, in some ways resembling integrated circuit fabrication techniques and in other ways somewhat resembling printed circuit board techniques. By way of example, conductor line widths are beginning to approach those used in at least older integrated circuit designs, and bonding techniques used to interconnect the chips to the HDMI are those typically used in conventional integrated circuit packaging. On the other hand, the materials used for the insulative layers, typically polymers, and the number of cross-overs required are more similar to that found in printed circuit board fabrication, as opposed to the silicon-oxide layer and the deposited metal interconnect layer of typical integrated circuits.

In the detailed description to follow, where relevant, specific prior art techniques will be identified as they more specifically relate to the new methods and structures disclosed herein.

BRIEF DESCRIPTION OF THE INVENTION

Hybrid circuit structures and methods of fabrication which result in improved manufacturing yields and reliability in use are disclosed. The methods disclosed include methods of forming on the hybrid circuit substrate, a ground plane, bonding pads, and interconnects, which minimize the likelihood of forming catastrophic defects in various insulation layers during the manufacturing processing, which minimize the likelihood of damage to the bonding pads when bonding integrated circuit leads thereto, and which minimize the thermal stressing of a finished product due to the differential expansion between the various layers making up the same. Alternate methods and structures are disclosed.

DETAILED DESCRIPTION OF THE INVENTION

Figure 1:
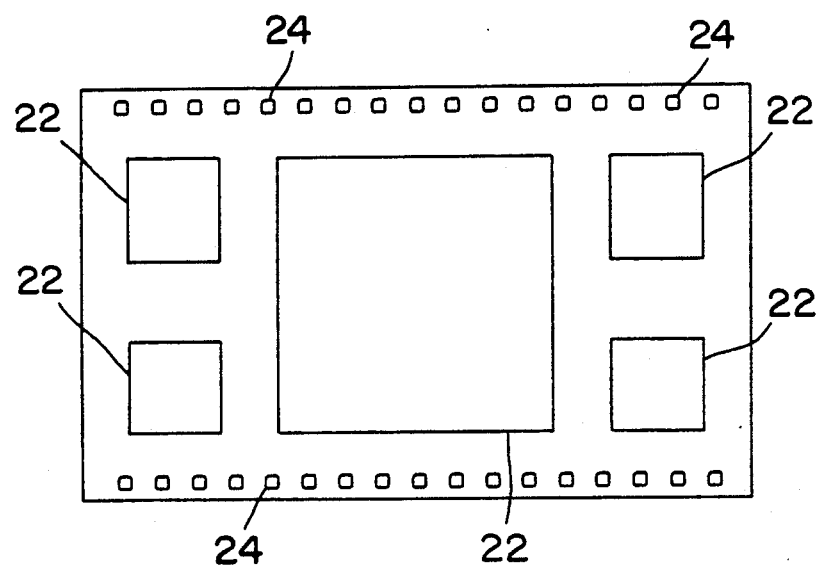
FIG. 1 is a top view of an exemplary high density multilayer interconnect system in accordance with the present invention.

First referring to FIG. 1, a top view of a schematic representation of a typical high density multi-layer interconnect (HDMI) with integrated circuits mounted thereon may be seen. This illustration is schematic only, as the complexity of such circuits, the number of interconnects, crossovers in the circuitry, etc., are normally too numerous to illustrate on such a scale. On the other hand, this figure is convenient for purposes of explanation as the same well illustrates functions and requirements of the HDMI technology. In particular, a substrate 20 may have pockets therein for integrated circuit chips 22, or alternatively may have the chips bonded to the upper surface of the substrate or the completed HDMI, which chips, when interconnected by the HDMI, will function as a complete system or subsystem of a much higher level than any of the individual chips themselves. Such a system might comprise, by way of example, a processor chip set together with memory, communication devices, etc., interconnected by the HDMI to provide a full microcomputer system on a substrate 20 of only a few inches on a side.

Obviously, to achieve the desired purpose, the substrate 20 must not only have formed thereon the required interconnects between the chips including crossovers, interconnections between layers, etc., but must also have not only some form of bonding pads 24 or other connection for connecting to the outside world, but must also have bonding pads (not shown because of limitations of scale) to which the leads from the individual chips 22 will be bonded. Typically, the integrated circuits 22, if mounted in pockets in the substrate, will be mounted so that the mounting pads thereon are substantially coplanar with the bonding pads on the HDMI, with the subsequent lead bonds being made on both the integrated circuit chips and the associated HDMI bonding pads using conventional integrated circuit bonding techniques, namely, ultrasonic welding. This then establishes certain requirements for the HDMI, namely, that it have bonding pads compatible with integrated circuit lead bonding techniques, and with a size and spacing also consistent therewith. This allows the lead bonding in the assembly of the integrated circuits to the HDMI utilizing conventional integrated circuit lead bonding equipment.

Figure 2A:
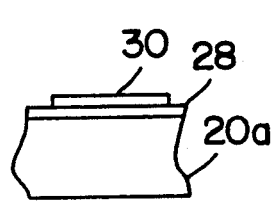
FIGS. 2a through 2c are cross-sections taken through a bonding pad, FIGS. 2a and 2b representing the prior art and FIG. 2c representing the bonding pad structure and method of the present invention.
Figure 2B:
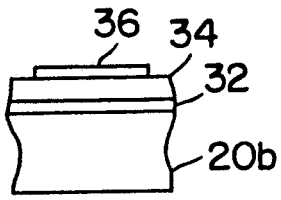
Figure 2C:
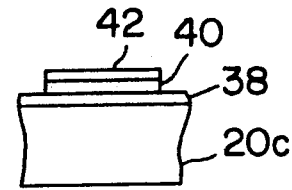

The first aspect of the present invention is illustrated in FIG. 2, wherein FIGS. 2a and 2b represent typical prior art structures and techniques for forming bonding pads, and FIG. 2c represents the structure and technique of the present invention. Each of these figures of course is a cross-section of a local area of the substrate taken through a bonding pad. In FIG. 2a, the substrate 28 is silicon with a silicon oxide layer 28 thereover, with a metal bonding pad 30 deposited directly to the silicon oxide. This structure provides ample support to the metallization 30 for the bonding pad during the actual bonding of leads thereto and from that standpoint is a highly satisfactory or ideal structure, as the oxide layer and the substrate itself each have a high elastic modulus and a high compressive yield strength to provide a rigid support for the pad during the bonding process. However, because of the semiconductive nature of the substrate, and the very thin insulative oxide layer, there is a substantial capacitive coupling between each bonding pad and the substrate, thereby slowing down the circuits mounted thereto. Also, because each bonding pad is strongly capacitively coupled to the substrate, the net result is a substantial capacitive coupling between pads, particularly between adjacent bonding pads, in a high speed circuit resulting in unintended coupling between signals of the operating circuit. In other cases, the substrate 28 may be a glass or other nonconducting substrate, in which case the bonding pad 30 may be directly deposited to the substrate. Here the capacitive coupling may be less, but still substantial for high dielectric substrates.

In FIG. 2b, substrate 20b is shown with layers 32 and 34 thereon in addition to the bonding pad 36. In this structure, the substrate 20b may be conductive, semiconductive, or insulative as desired. If conductive, layer 32 probably would not be present, though if semiconductive such as of silicon, layer 32 would typically be an oxide layer. If the substrate 20b is insulative, layer 32 may represent a ground plane metallization, which might also be used over an oxide layer on a semiconductive substrate. In any event, in the prior art structures of the type shown in FIG. 2b, layer 34 is a relatively thick polymer layer, typically comprising a plurality of polymer layers because of the bonding pads being on the top of the HDMI, the polymer used being the same insulative polymer as is used in insulating the various conductive levels of the HDMI. Such polymers are generally selected for their relatively low elastic modulus to minimize thermal stressing, typically also being characterized by a reasonably low compressive strength. By way of example, such polymer's typically have an elastic modulus of less than approximately 500,000 psi and a compressive strength of less than approximately 25,000 psi. The net result is a bonding pad structure which is difficult to bond leads to. In particular, preferably the bonding pad support will have a compressive strength greater than the plastic flow strength of the gold or aluminum lead material. Also, when the bonding pad structure of FIG. 2b is subjected to the ultrasonic welding energy, the polymer layers 34 tend to move around like gelatin, so that the ultrasonic energy tends to be dissipated in the layers of polymer rather than at the interface between the bonding pad 36 and the lead being bonded thereto. Consequently, with this structure it is very difficult to obtain the desired repeatable and reliable bonds necessary.

Now referring to FIG. 2c, the bonding pad structure of the present invention may be seen. Here the substrate 20c is shown with a layer of ground plane metallization 38 thereon with a thin layer of polymer 40 supporting the metallized bonding pad 42. The substrate 20c may be any of the commonly used substrates such as silicon with an oxide layer thereover, a glass or other insulative material, or for that matter a conductor, though if a conductor is used a separate ground plane metallization layer 38 would not be present. In any event, the bonding pad 42 is insulated from the ground plane metallization (or the substrate) by a thin layer 40 of a high compressive yield strength insulative layer having a low dielectric constant. Preferably the insulative layer used will have a modulus of elasticity of at least approximately 1,000,000 psi, a compressive yield strength of at least approximately 100,000 psi and a dielectric constant of less than approximately 4. The relatively low dielectric constant minimizes the capacitive coupling with the metallization layer of the substrate. With respect to thickness, preferably the layer of polymer 40 is applied in a thickness range of 4 to 10 microns in comparison to the usual thickness of a thick layer of polymer 34 used in the prior art of FIG. 2b of approximately 20 to 50 microns for a four metallization level HDMI.

Suitable classes of polymers include some acetylene terminated polyimides and modified polyimides formulated for high compressive strength. The thin layer is preferred, as it provides a particularly rigid support for the bonding pad during the ultrasonic welding process and does not substantially disturb the topography when the thick layer of polymer is applied thereover as part of the subsequent processing steps. As shown, the thin layer of polymer 40, once applied, is shaped rather than being left as a uniform layer over the ground plane 38. The primary reason for this is to minimize thermal stressing, as large areas of rigid polymer bonded to much lower thermal coefficient of expansion materials can result in very high thermal stresses and failures as a result thereof, particularly after temperature cycling. Preferably the thin layer of low dielectric constant, high yield strength polymer is metallized before shaping, with the bonding pad metallization and the polymeric layer both thereafter being shaped, the metal layer being shaped by the usual photolithographic and etching processes and the polymer layer being shaped using a plasma etch, such as a $CF_4$ or $FS_6$ plasma etch, and using the bonding pad metallization layer, which is uneffected by the plasma etch, as a mask.

Figure 3:
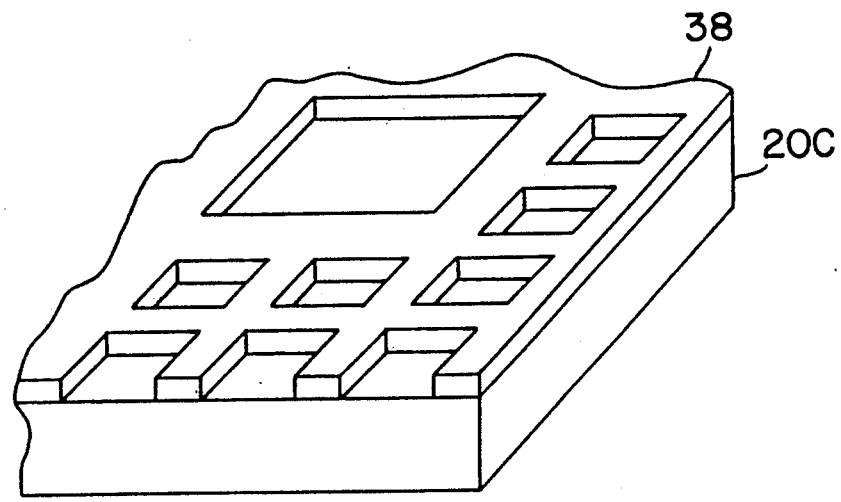
FIG. 3 is a perspective view of a section of substrate illustrating a patterned ground plane layer thereon.

While FIG. 2c represents a typical cross-section through a bonding pad fabricated in accordance with the present invention, it should be noted that the ground plane metallization itself can be a source of substantial thermal stressing because of the difference in the thermal coefficients of expansion between the metallization layer and the adjacent substrate. Aside from possible separation, other problems which may occur due to thermal stressing of the ground plane metallization, including for at least aluminum metallization layers, the extrusion of spike-like projections upward from the surface of the metallization which can pierce an insulative layer thereabove to short the ground plane to the first interconnect layer thereabove after a number of temperature cyclings, thereby resulting in a premature failure of the HDMI. Accordingly, to relieve the stresses it is preferable to pattern the ground plane after deposition to provide a stress relief for this thermal stressing. This is illustrated in FIG. 3, wherein the ground plane metallization layer 38 on the substrate 20c is shown as being patterned, typically in a repetitive pattern though the same may well be irregular in certain respects as may be dictated by or convenient for other purposes. Preferably, the pattern is kept relatively small, with about fifty percent of the pattern area being open. The bonding pads however, as shown in FIG. 2c, should be formed over a metallized portion to block the capacitive coupling from the bonding pad to the substrate, as high dielectric substrates and substrates such as an oxide covered silicon substrate could couple the signals between bonding pads if the same are not isolated from the substrate by the metallization layer thereunder.

Figure 4:
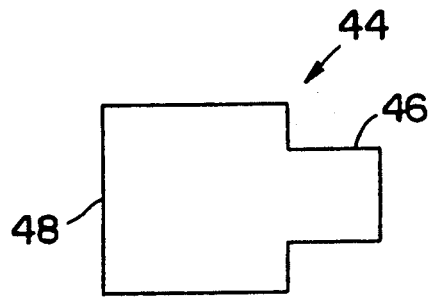
FIG. 4 is a plan view of a typical bonding pad.

The shape of a typical bonding pad in accordance with the present invention may be seen in FIG. 4. The bonding pad, generally indicated by the numeral 44, comprises two primary integrally connected areas, namely, region 46 which is the bonding area to which a lead will be ultrasonically welded, and a second region 48 which, as shall subsequently seen, is the region the next metallization layer is deposited on and thus connected to form the required vias or layer interconnections for the circuit.

Figure 5:
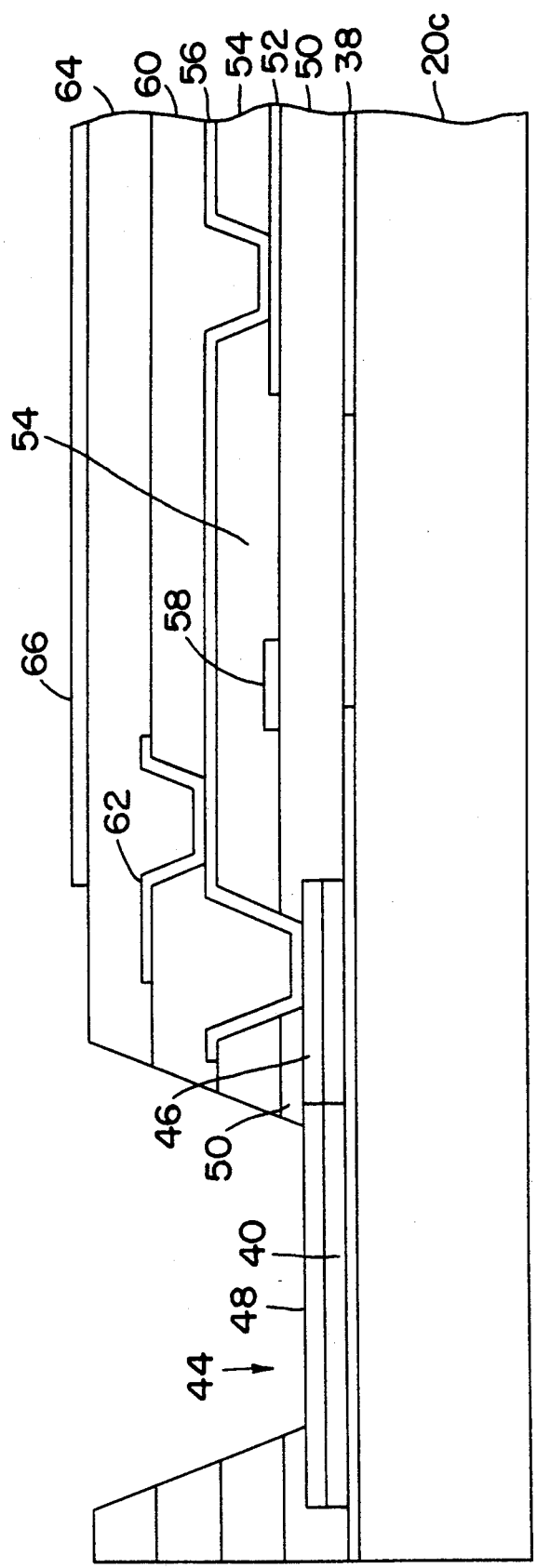
FIG. 5 is a cross-section of a bonding pad region in a high density multilayer interconnect.

Now referring to FIG. 5, a cross-section of a substrate taken through one of the bonding pads illustrating the structure of the bonding pad of FIG. 2c and various other aspects of the structure and methods of the present invention may be seen. In this example, as in the bonding pad structure of FIG. 2c, the substrate 20c, which may be, by way of example, a silicon substrate with an oxide layer 38 thereon, is first covered with a thin layer of polymer 40 and then a metallization layer. The metallization layer and the thin layer of polymer are then shaped or etched away in a pattern, the metal etched in a conventional photolithographic and etching process and the polymer etched away by a plasma etch using the remaining metal as a mask. This leaves the bonding pad metallization 44 on the thin layer of polymer thereunder. Thereafter, the substrate is coated with a thick polymer layer 50 over the entire substrate.

After the first layer of thick polymer is applied over the bonding pads in the prior art, the layer was then patterned by putting down a layer of metal, patterning the same by the usual photolithographic and etching processes, and then the bonding pads exposed both in region 48 thereof and in the region 46 by a plasma etch so that the next metallization layer to be put down will make contact with region 46 as may be required to interconnect that next metallization layer. In the present invention however, this is not done, but instead the next metallization layer 52 is put down immediately and patterned to form the first layer of interconnects. Thereafter, a second thick layer of polymer 54 is applied, and then the layer of polymer 54 as well as the layer 50 is removed to expose regions 46 of the bonding pads so that the next metallization layer]namely layer 56 in FIG. 5, will make contact therewith. At the same time, polymer layer 54 is removed at selected regions over part of metallization layer 52 so that metallization layer 56 will also make contact with metallization layer 52 as desired, so that contact between the bonding pad and metallization layer 52 is provided, but only after the second thick polymer layer 54 has been applied.

Figure 8:
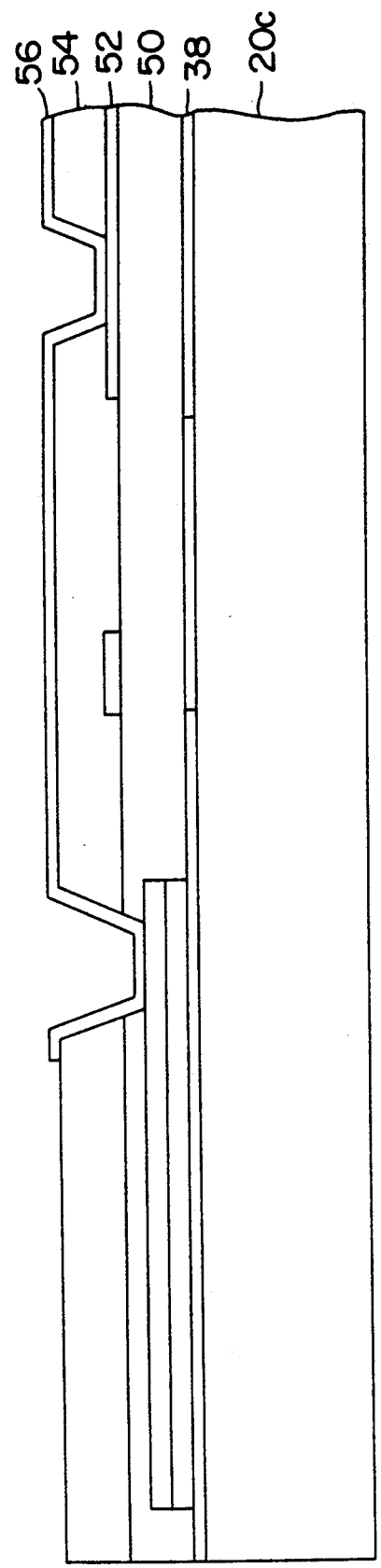
FIG. 8 is a cross-section similar to that of FIG. 5 illustrating the structure of FIG. 5 at an intermediate stage of fabrication.

It is important to note that during the patterning of the polymer layer 54 and the polymer layer 50, these polymer layers over region 48 of the bonding pad 44 are not removed, but instead the polymer allowed to build up over the bonding pad region 48 by each successive application of a thick layer of polymer. Thus after depositing metal layer 56 and patterning the same, the partially fabricated device appears as shown in FIG. 8.

The foregoing process is to be compared with the prior art wherein the bonding pads are exposed after the first layer of thick polymer is provided thereover. Because the polymer is removed by a plasma etch using a deposited and patterned metal layer as a mask, which layer is defined by photolithographic processes, there is some chance that the metal mask will be imperfect to start with, or alternatively, a pinhole will be formed therein by contact with the photomask used in the photolithographic process. Any slight pinhole in the mask will allow the plasma etching process to etch through the pinhole also, which can result in a small tunnel through the thick polymer layer down to the ground plane, which tunnel becomes metallized when metallization layer 52 is deposited. If this flaw is located under a region of layer 52 which is to remain metallized after patterning, and of course reaches down to a metallized portion of the ground plane, it will short the two layers together, resulting in a rejected part. In the present invention however, where the first plasma etch occurs only after the second thick polymer layer 54 is provided, such tunnels are unlikely to extend through both layers. While tunneling could occur through the thick polymer layer 54 so as to eventually short metal layers 52 and 56 together in regions where no such interconnection was desired, the probability of a flaw falling in a location where this could occur is far less than the prior art shorting of the first metallization layer to the ground plane, as even a patterned ground plane will have approximately a 50 percent coverage whereas any one metallized patterned interconnect layer will cover no more than 5 to 10 percent of the total area. In that regard, it should be noted that in FIG. 5, metallized layer 56 is in direct contact with metallized layer 52, etc. In any typical HDMI there will be independent portions of the layers such as layers 52 and 56 which are not in electrical contact with each other, but merely interconnected with the bonding pads and/or portions of other metallized layers, such as by way of example, metallized portion 58.

Figure 9:
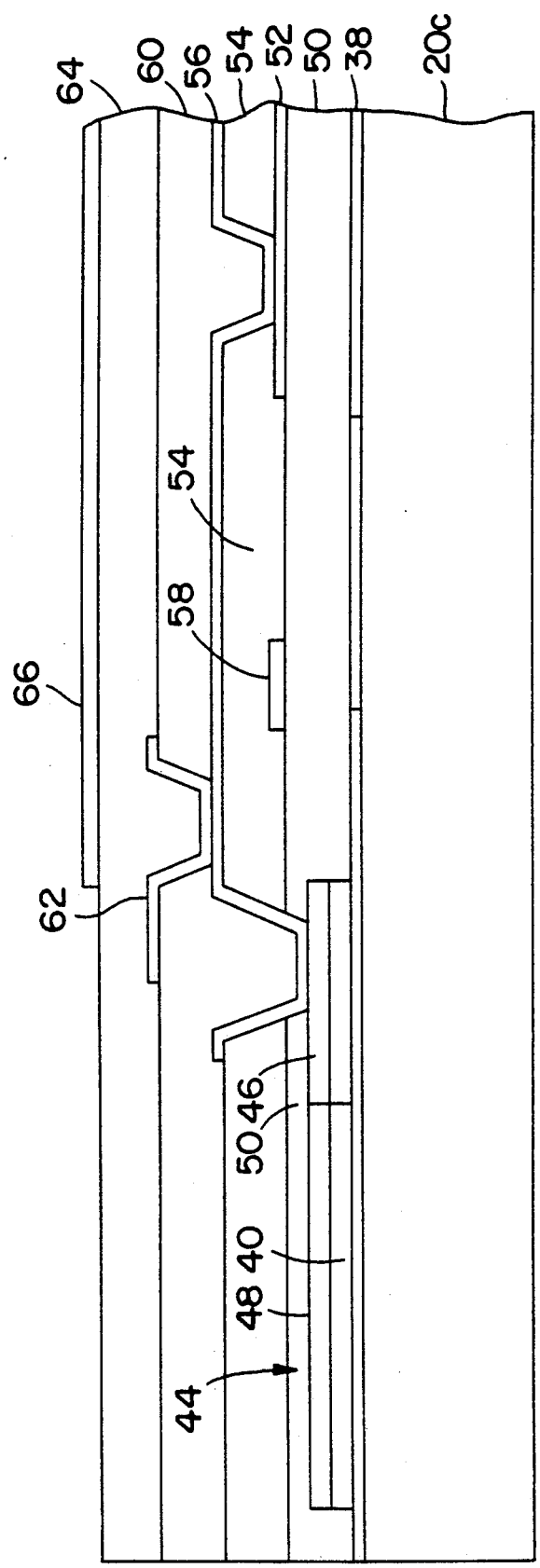
FIG. 9 is a cross-section similar to FIG. 8 showing the structure of FIG. 5 at a later intermediate stage of fabrication than shown in FIG. 8.

After metallized layer 56 is patterned, additional polymer layers 60 are put down, patterned, additional metallized layers 62 deposited thereover and patterned, etc. until the desired number of interconnect layers and the interconnections thereof have been obtained. Thereafter a final thick polymer layer 64 may be put down to insulate the top surface of the HDMI, and if desired a top metallized ground plane layer 66 may be provided. Here again all of these layers are put down and processed before any of the thick polymer layers over regions 48 of the bonding pads 44 are removed to expose the bonding pad. Thus, by way of example, at this stage of fabrication the cross-section will appear as shown in FIG. 9.

Figure 6:
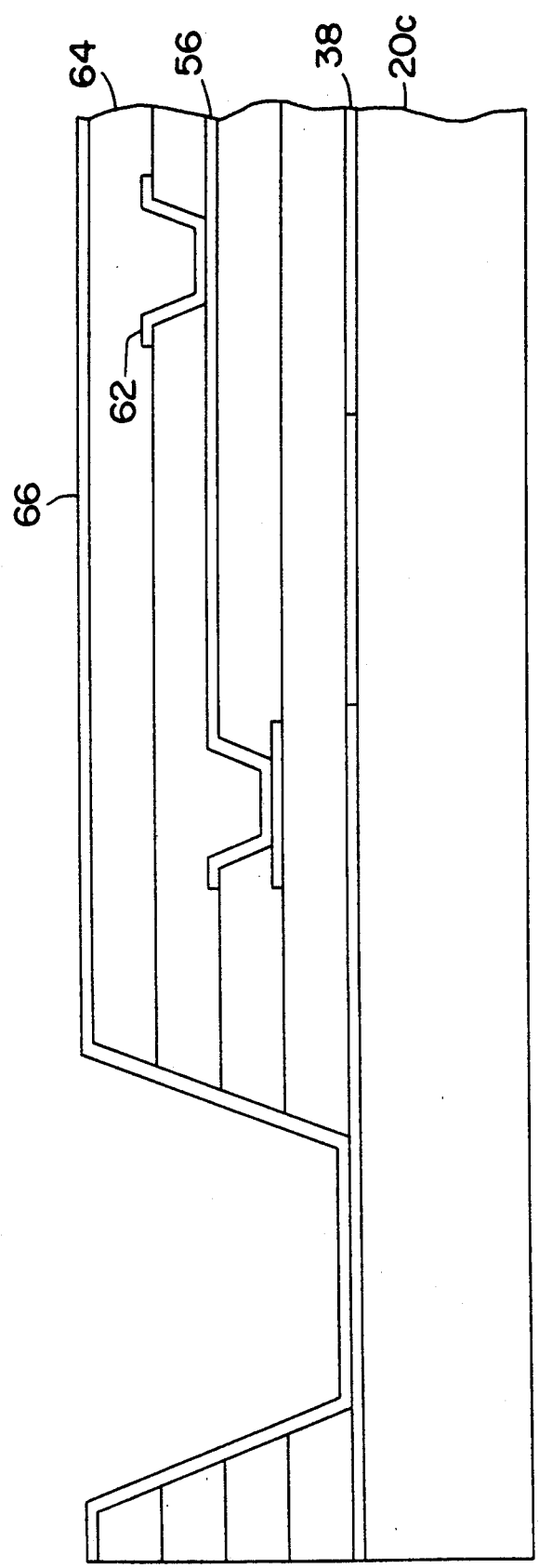
FIG. 6 is a cross-section similar to FIG. 5, though showing the interconnection of upper and lower ground planes and the bonding pad formed thereby.
Figure 7:
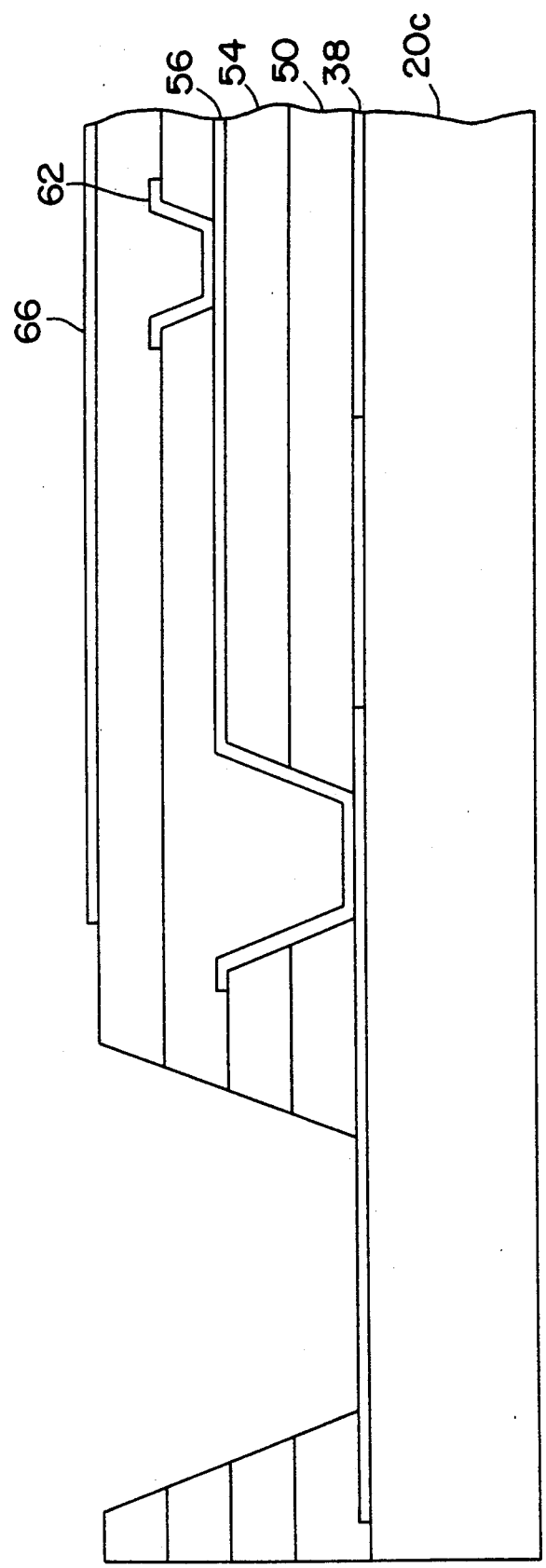
FIG. 7 is a cross-section similar to FIGS. 5 and 6, though illustrating the use of an isolated region of a ground plane as a bonding pad as applicable, for example, to insulative substrates.

If a top ground plane 66 is used, the same may be coupled to the lower ground plane 38, and of course to a bonding pad, after the applicable bonding pad has been exposed. If on the other hand, ground connections are to be made not only to the lower ground plane layer, but to ground connections at other elevations of the interconnect, the same may be interconnected as shown in FIG. 6. In some instances wherein an insulative substrate is used, bonding pads may be defined as isolated pad areas within the ground plane layer. Accordingly, FIG. 7 would apply to such situations also. Finally of course, while not shown, in instances where the upper ground plane 66 is used a final insulative layer (not shown) is normally used to insulate the ground plane from externally imposed probes, etc.

In the prior art, when the bonding pads were at or near the substrate level rather than on the top of the HDMI, it was common to remove each layer of polymer from the bonding pads before proceeding with the next layer. However, the opening for the bonding pads continues to get deeper and deeper as fabrication proceeds. Also, on the application of each layer of polymer, the resulting cavity at each bonding pad tends to fill with the polymer, providing a polymer layer over the bonding pads of increasing thicknesses as the fabrication proceeds. This in turn requires more and more etching to clean out the region over the bonding pads as each layer of polymer is formed, which etching is more than required to otherwise form that layer. Accordingly, in accordance with the prior art methods, additional layers of polymer tend to be subjected to excessive etching, increasing the risk of forming destructive metallized channels through one or more polymer layers. In the present invention, the single polymer removal at the end reduces the total amount of etching required, thereby helping in both the yield and reliability of the final product. Further, to the extent the bonding pad opening of the prior art did not fully refill when each subsequent polymer layer is applied, the topography of the top surface of the product at the intermediate fabrication steps would deviate substantially from planar, making the photolithographic processes for forming the pattern metal layers more difficult and imprecise.

In the prior description, reference was made to lead bonding by way of ultrasonic welding, though it is to be understood that other processes are also useable, such as thermal compression bonding and combinations of ultrasonic welding and thermal bonding processes. Also while plasma etching was also referred to as a technique for removal or patterning of the polymer layers, it is to be understood that other processes may also be used for this purpose.

Thus there has been described herein new and unique methods and structures for bonding pads, ground planes and related structures. While the preferred method and structures have been described in detail herein, it will be understood by those skilled in the art that various changes in form and detail may be made therein without departing from the spirit and scope of the invention.

I claim:

1. In a method of forming a ground plane on a substrate in a high density multilayer interconnect fabrication process, comprising the steps of;
    (a) depositing a layer of metal on the substrate;
    (b) putting a layer of polymer over the layer of metal deposited in step (a);
    (c) depositing a layer of metal over the layer of polymer in step (b);
    (d) patterning the layer of metal of step (c), and the layer of polymer of step (b) where the same is not masked by the remaining parts of the metal layer of step (c);
    (e) putting a layer of polymer over the layer of metal deposited in step (a);
    (f) depositing a layer of metal over the layer of polymer of step (e);
    (g) patterning the layer of metal of step (f);
    (h) putting a layer of polymer over the patterned layer of metal;

(i) patterning the layer of polymer of step (h), and the layer of polymer of step (e) where the same is not masked by the metal layer of steps (f) and (g); and whereby the first patterning of the polymer layer of step (e) occurs after the polymer layer of step (h) is applied; and wherein steps (b) through (d) in part form the bonding pads for the high density multilayer interconnect.

2. The method of claim 1 further comprising the steps of;

(j) depositing a layer of metal over the layer of polymer of steps (h) and (i), and;

(k) patterning the layer of metal of step (j), whereby the layer of metal of steps (j) and (k) will interconnect the same with the metal layer of steps (b) and (c) in regions where the latter are exposed by the patterning of step (i).

3. The method of claim 2 wherein step (i) exposes at least one region of the metal layer of steps (f) and (g), whereby the layer of metal of steps (j) and (k) will interconnect the metal layer of steps (f) and (g) and the metal layer of steps (j) and (k).

4. The method of claim 1 wherein the polymer layer of step (b) is a layer of high compressive yield strength polymer.

5. The method of claim 4 wherein the polymer layer of step (b) is also a layer of low dielectric constant polymer.

6. The method of claim 5 wherein the polymer layers other than that of step (b) are layers of low modulus of elasticity polymers.

7. The method of claim 6 wherein the polymer layer of all steps other than step (b) are made substantially thicker than the polymer layer of step (b).

8. The method of claim 1 wherein steps (b) through (d) in part form the bonding pads for the high density multilayer interconnect.

9. The method of claim 8 wherein layers of polymer above the bonding pads are not patterned to expose the bonding pads until no further layers of polymer are to be applied thereover prior to bonding leads thereto.

10. The method of claim 1 wherein the polymers layers are layers of low modulus of elasticity polymers.

* * * * *